United States Patent [19]

Ishida et al.

[11] Patent Number: 4,497,063
[45] Date of Patent: Jan. 29, 1985

[54] FM STEREO DEMODULATOR

[75] Inventors: Kohji Ishida; Tadashi Noguchi; Tatsuo Numata, all of Tokyo, Japan

[73] Assignee: Pioneer Electronic Corporation, Tokyo, Japan

[21] Appl. No.: 392,130

[22] Filed: Jun. 25, 1982

[30] Foreign Application Priority Data

Jun. 26, 1981 [JP] Japan .................. 56-99920
Jun. 26, 1981 [JP] Japan .................. 56-99921

[51] Int. Cl.³ ............................................. H04H 5/00
[52] U.S. Cl. ........................................ 381/7; 381/13; 381/4
[58] Field of Search ............... 307/529; 329/50, 146, 329/147, 124; 332/37 R, 41; 381/1-4, 7, 10, 13, 8, 9

[56] References Cited

U.S. PATENT DOCUMENTS

| 3,175,155 | 3/1965 | Holder | 329/147 |
| 4,149,161 | 3/1980 | Hershberger | 381/7 |
| 4,160,217 | 7/1980 | Ohsawa | 329/50 |
| 4,288,752 | 9/1981 | Ogawa | 329/50 |
| 4,362,906 | 12/1982 | Ishida | 381/7 |

Primary Examiner—Gene Z. Rubinson
Assistant Examiner—W. J. Brady
Attorney, Agent, or Firm—Fleit, Jacobson, Cohn & Price

[57] ABSTRACT

An FM stereo demodulator having improved separation and distortion characteristics comprising a high-frequency pulse signal which is modulated by a sinusoidal subcarrier signal produced in accordance with a stereo pilot signal. The high-frequency pulse signal is multiplied with a composite signal at a multiplier so as to reproduce left and right signals without frequency components of noise. Constructed accordingly, the invention advantageously obviates the use of a low-pass filter which injects delay characteristics and reduces gain of the composite signal from an FM demodulator.

9 Claims, 27 Drawing Figures

FM STEREO DEMODULATOR

BACKGROUND OF THE INVENTION

1. Field of the Invention

The present invention relates to an FM stereo demodulator, and more specifically to an FM stereo demodulator to be used in a high fidelity FM receiver circuit.

2. Description of the Prior Art

FM stereo demodulators, used in a stereophonic FM receiver for separating left and right signals from an AM-FM composite signal (FM detector output signal) are divided into several types.

Among those prior art demodulators, a switching type FM stereo demodulator is popularly used. In the switching type demodulator, left and right signals are separated in a manner that the composite signal is switched by a square-wave subcarrier signal of 38 kHz derived from a pilot signal contained in the composite signal.

Since the square-wave subcarrier signal includes odd hamonics of fundamental 38 kHz signal, and it is used as a switching control signal, low pass filters (LPF) must be used so as to reduce the components of the higher hamonics contained in reproduced left and right signals (the output signals of switching cirucuit).

However, the utilization of low pass filters causes such problems as the deterioration of delay characteristic of composite signal and the reduction of amplitude of necessary range of composite signal, which result in the deterioration of separation characteristic, and an increase of distortion of the demodulated stereophonic signal.

SUMMARY OF THE INVENTION

An object of the present invention, therefore, is to eliminate the above-mentioned drawbacks of the prior art FM demodulator, and to provide an FM demodulator without need of low pass filters.

Another object of the present invention is to provide an FM demodulator having an excellent characteristic of high fidelity stereophonic signal demodulation.

According to the present invention, an FM stereo demodulator for producing left and right signals from an FM detector output signal including a stereo pilot signal comprises means for producing a sinusoidal subcarrier signal synchronized with the stereo pilot signal, a pulse modulator for modulating a high frequency pulse signal by the sinusoidal subcarrier signal, and a multiplier for multiplying the FM detector output signal and the pulse modulation signal produced by the pulse modulator, thereby reproducing the left and right signal.

According to an aspect of the invention, the pulse modulator takes the form of a pulse width modulator circuit.

According to another aspect of the invention, the pulse modulator takes the form of a pulse position modulator circuit.

The foregoing and other objects and advantages of the invention will become more clearly understood upon review of the following description taken in conjunction with the accompanying drawings.

DETAILED DESCRIPTION OF A PREFERRED EMBODIMENT

Figure 1:
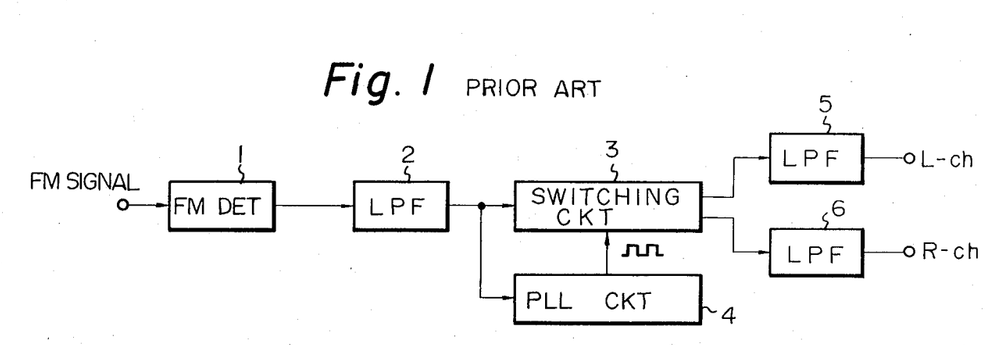
FIG. 1 is a block diagram of a prior art FM stereo demodulator.

Reference is first made to FIG. 1, in which the block diagram of an example of a typical prior art FM stereo demodulator is illustrated.

The FM stereo demodulator comprises an FM detector 1 which converts an FM IF (intermediate frequency) into a composite signal.

The output signal of the FM detector 1 (composite signal) is applied into a switching circuit via a LPF (low pass filter) 2 in which undesired components of the composite signal are rejcted.

The output signal of the low pass filter 2 is also applied to a PLL (phase locked loop) circuit 4 in which a square-wave subcarrier signal of 38 kHz is produced in synchronization with a pilot signal of 19 kHz contained in the output signal of the low pass filter 2.

The square-wave subcarrier signal produced by the PLL circuit 4. is applied to the switching circuit 3 to control the switching operation.

Left and right signals are thus derived by the switching circuit 3, then respectively applied to a pair of low pass filters 5 and 6 in which the components other than audio output signal are rejected.

Figure 2A:
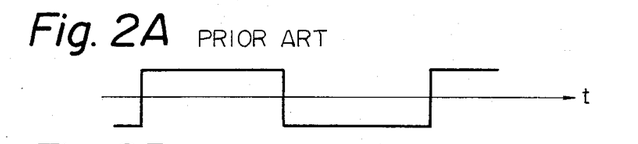
FIGS. 2A through 2E are diagrams showing the operational characteristics of the prior art FM stereo demodulator shown in FIG. 1.

By using the Fourier series, the square-wave sub-carrier signal of 38 kHz shown in FIG. 2A, used as a switching control signal, can be expressed as follows:

$$F(t) = \frac{4}{\pi} \sin\omega_s t + \frac{4}{3\pi} \sin 3\omega_s t + \frac{4}{5\pi} \sin 5\omega_s t + \quad (1)$$

$$\frac{4}{(2n-1)\pi} \sin(2n-1)\omega_s t$$

in which $\omega_s$ is angular frequency of the square-wave sub-carrier signal, and n is a natural number.

Figure 2B:
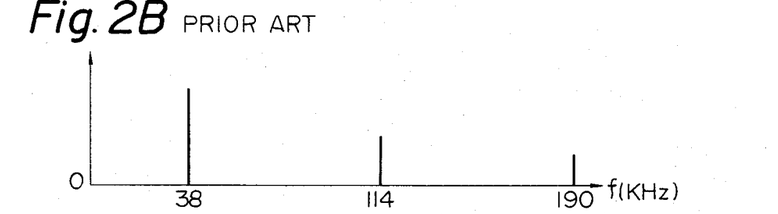

As shown by the frequency spectrum of FIG. 2B, the square-wave subcarrier signal F(t) contains odd hamonics such as components of 114 kHz, 190 kHz besides the fundamental wave of 38 kHz.

Consequently, the output signals of the switching circuit 3 in which the multiplication of the FM detector output signal, that is, the composite signal and the square-wave subcarrier signal F(t) takes place, contain signal components due to odd harmonics of square-wave subcarrier.

Figure 2C:
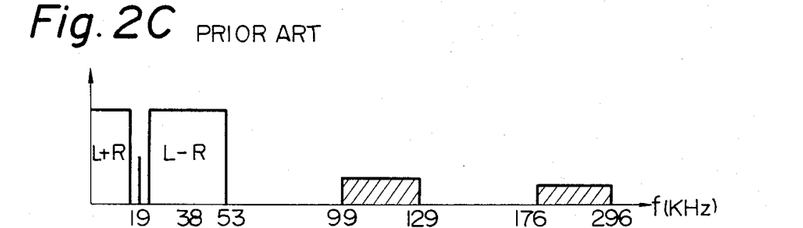

Assuming that the pass band of the low pass filters 5 and 6 is 0 through 15 kHz, then the output signals appearing at the output terminals of low pass filters 5 and 6 are formed by a main signal of 0 through 15 kHz, a subsignal of 38±15 kHz and the components of 114±15 kHz and 190±15 kHz which are mainly noise signals or nearby disturbing waves, as shown in FIG. 2C.

Figure 2D:
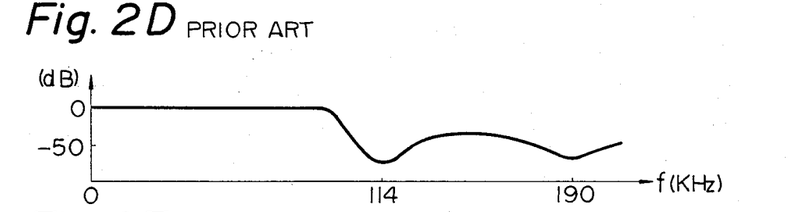

In order to reduce these components due to the odd harmonics of subcarrier signal, a low pass filter 2 connected to the output of the FM detector 1 must have an attenuation characteristic in which attenuating factor is high at 114 kHz and 190 kHz as shown in FIG. 2D.

However, the using of the low pass filter 2 having the above-mentioned attenuation characteristic causes such problems that the delay characteristic and the amplitude characteristic of the composite signal are deteriorated at the range of the subsignal component.

Figure 2E:
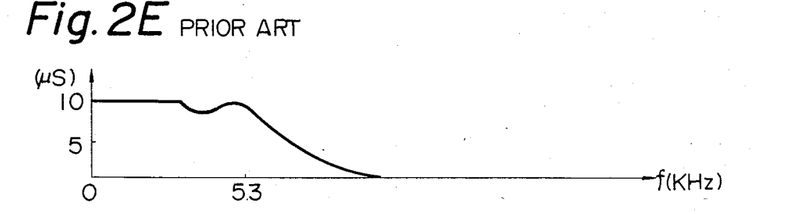

FIG. 2E shows an example of delay characteristics of a composite signal after passing through the low pass filter 2'.

As shown in FIG. 2E, the disturbance of the delay characteristic is seen within the range of subsignal frequency 23 through 53 kHz especially since the disturbance component of 114 kHz is a proximity of composite signal.

Such disturbance of the delay or amplitude characteristic of the composite signal results in the deterioration of the separation characteristic and the distortion characteristic of the stereophonic demodulated signal as mentioned hereinbefore.

The principles of the present invention will now be described with reference to FIG. 3.

The FM stereo demodulator according to the present invention comprises a multiplier circuit 3 which receives an output signal of an FM detector 1 via a low pass filter 2.

The output signal of the FM detector 1 is also applied to a subcarrier signal generator 7 which produces a sinusoidal subcarrier signal of 38 kHz synchronized with the pilot signal. In other words, FM detector 1 demodulates an FM-IF signal and subcarrier signal generator 7 responds to that stereo composite signal by generating the sinusoidal subcarrier signal synchronized with the pilot signal.

The sinusoidal subcarrier signal produced by the subcarrier signal generator 7 is applied to a pulse modulator circuit 8 in which a high frequency clock pulse signal of a frequency above 500 kHz is modulated in accordance with the sinusoidal subcarrier signal.

A pulse modulation signal thus produced by the pulse modulator circuit is then applied to the multiplier circuit 3 wherein the multiplication of the FM detector signal and the pulse modulation signal takes place.

A pair of output signals of the multiplier circuit 3 are then respectively applied to a pair of low pass filters 5 and 6 wherein the components of the output signals of the multiplier circuit 3 other than audio frequency component are rejected so as to produce left and right signals respectively.

The pulse modulator circuit may preferably be a pulse width modulation (PWM) circuit or a pulse position modulation (PPM) circuit.

Referring to FIGS. 4A through 4G, the operation and characteristic of the above explained FM stereo demodulator will now be explained.

Figure 4A:
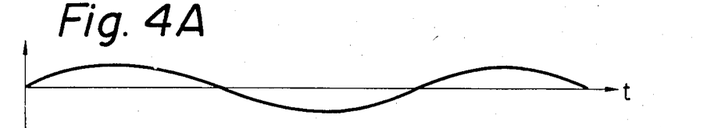
FIGS. 4A through 4G are diagrams showing the operational characteristics of the FM stereo demodulator shown in FIG. 3.

FIG. 4A shows the waveform of the sinusoidal subcarrier signal of 38 kHz produced by the subcarrier signal generator circuit.

Figure 4B:
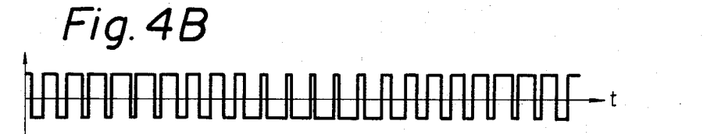

FIG. 4B shows the waveform of a pulse width modulation (PWM) signal produced by a first type of the pulse modulator circuit 8 which takes the form of a pulse width modulation circuit.

Figure 4C:
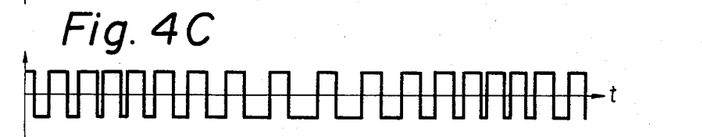

Similarly, FIG. 4C shows the wave form of a pulse position modulation (PPM) signal produced by a second type of the pulse modulator circuit 8 which takes the form of a pulse position modulation circuit.

The freqency spectrum of these pulse modulation signals has a component of 38 kHz corresponding to the sinusoidal subcarrier signal used as the modulation signal and components corresponding to the frequency of the carrier of the pulse modulation signal and odd harmonics of the carrier. As shown in FIGS. 4B and 4C, the pulses have a predetermined pulse repetition frequency higher than the frequency of the sinusoidal subcarrier signal and the edge positions of each pulse varies with the sinusoidal subcarrier signal.

Figure 4D:
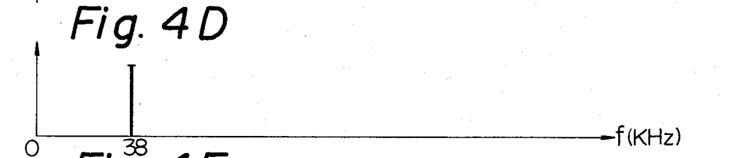

However, since the frequency of the clock pulse signal, i.e., the carrier is selected above 500 kHz, the frequency spectrum can be illustrated as FIG. 4D.

Figure 4E:
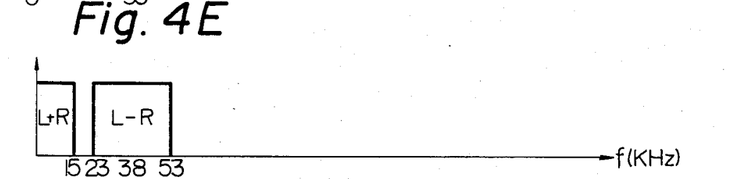

Therefore, the output signals of the multiplier circuit 3 include only the component of the main signal (0 through 15 kHz) and the subsignal (23 through 53 kHz) of the FM detector output signal as shown in FIG. 4E, since the components corresponding to the carrier frequency (500 kHz) and odd harmonics thereof are neglectable.

Figure 4F:
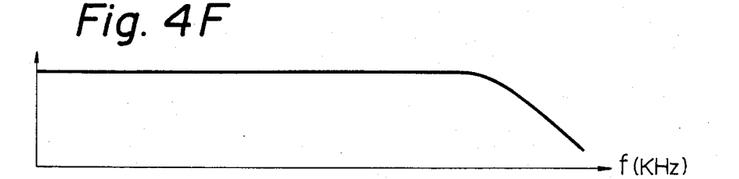

Accordingly, the attenuating characteristic required to the low pass filter 2 is to only cut off the frequency component above the carrier frequency of 500 kHz as shown in FIG. 4F.

Figure 4G:
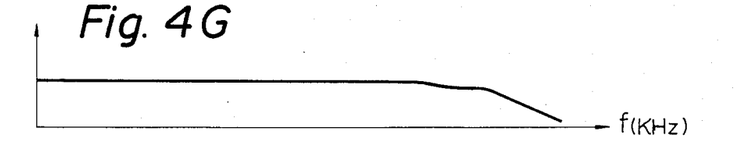

Therefore, the delay characteristic of the low pass filter 2 is made flat up to a higher frequency as shown in FIG. 4G.

Thus, the delay characteristic and the amplitude characteristic of the FM detector output signal through the low pass filter 2 are maintained at its optimal states, thereby assuring excellent distortion-free and separation charateristics of the FM stereo demodulator output signal.

In addition, the low pass filter 2 can be omitted when the frequency range of the output signal of the FM detector 1 is not extended to the high frequency band.

The operation of the FM stereo demodulator shown in FIG. 3 will now be explained mathematically.

The main signal M(t) and the subsignal S(t) contained in the composite signal are respectively expressed as follows:

$$M(t) = L(t) \pm R(t), \quad S(t) = L(t) - R(t)$$

in which L(t) and R(t) are left signal and right signal of a stereophonic signal.

If the subcarrier signal is $\sin \omega_S t$, then the composite signal C(t) is expressed as follows:

$$C(t) = M(t) + S(t) \sin \omega_S t \ldots \quad (2)$$

in which a component corresponding to the pilot signal is omitted for the purpose of simplification.

Since the main component of the pulse modulation signal, i.e., the output signal of the pulse width modulation (PWM) circuit or the pulse position modulation (PPM) circuit is $\sin \omega_S t$, the output signal of the pulse modulation circuit 8 is expressed as $\frac{1}{2} \pm \sin \omega_S t$ when dc component is taken into account.

The pair of output signals of the multiplier circuit 3 is therefore expressed as follows:

$$V_L(t) = (\tfrac{1}{2} + \sin \omega_S t) C(t) \ldots \quad (3)$$

$$V_R(t) = (\tfrac{1}{2} - \sin \omega_S t) C(t) \ldots \quad (4)$$

By substituting C(t) in the equations (3) and (4), $$V_L(t) = \tfrac{1}{2}[M(t)+S(t)] + [\tfrac{1}{2}S(t)+M(t)]\sin \omega_S t - \tfrac{1}{2}S(t)\cos 2\omega_S t \ldots \quad (5)$$

$$V_R(t) = \tfrac{1}{2}[M(t)-S(t)] + (\tfrac{1}{2}S(t)-M(t))\sin \omega_S t + \tfrac{1}{2}S(t)\cos 2\omega_S t \ldots \quad (6)$$

Since the only audio frequency component of the multiplier circuit 3 passes through the low pass filters 5 and 6, the output signals of the low pass filters 5 and 6 are expressed as follows:

$$V'_L(t) = \tfrac{1}{2}[M(t)+S(t)] = L(t) \ldots \quad (7)$$

$$V'_R(t) = \tfrac{1}{2}[M(t)-S(t)] = R(t) \ldots \quad (8)$$

Figure 3:
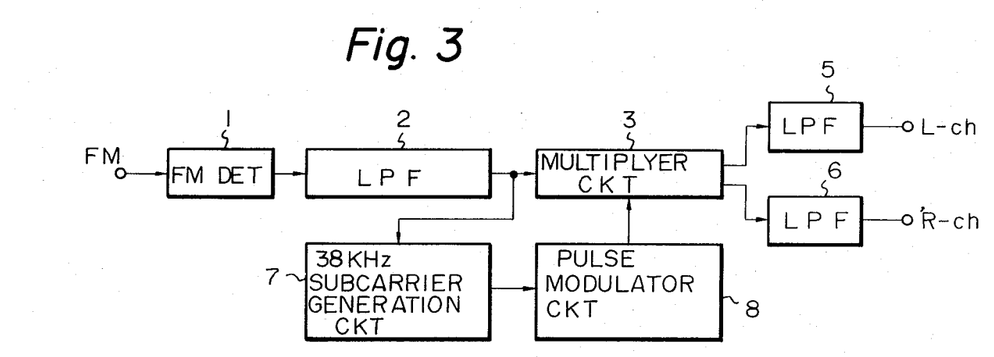
FIG. 3 is a block diagram of an embodiment of an FM stereo demodulator according to the present invention.

Thus, left and right signals are reproduced by the FM stereo demodulator shown in FIG. 3.

Figure 5:
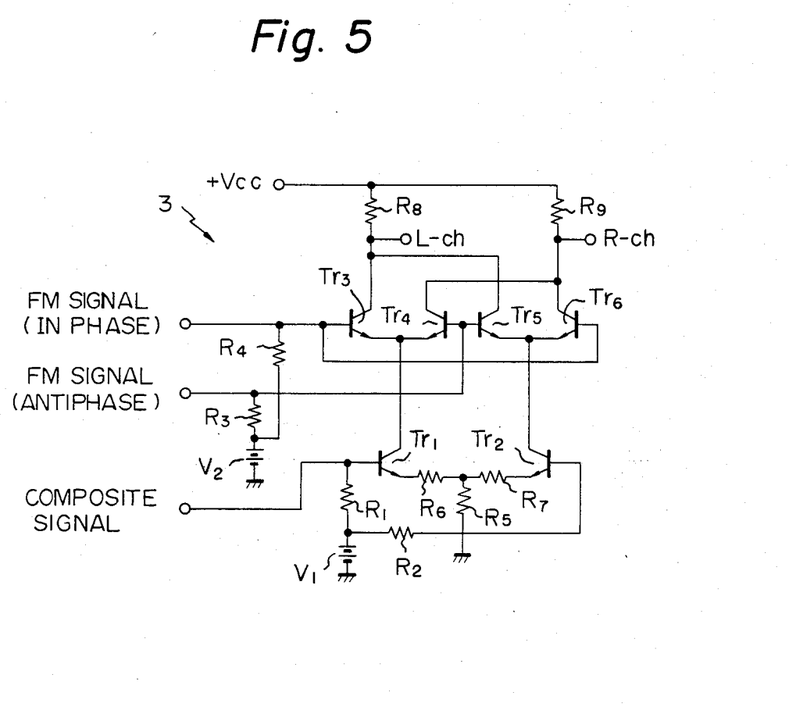
FIG. 5 is a circuit diagram of an example of the multiplier shown in FIG. 3.

Referring to FIG. 5 an example of multiplier circuit 3 will be described hereinafter.

As shown, the multiplier circuit takes the form of a double balance differential circuit.

The circuit comprises a pair of transistors $Tr_1$ and $Tr_2$, whose bases receive the composite signal from the FM detector circuit.

Resistors $R_6$ and $R_7$ respectively connected to the emitter of transistors $Tr_1$ and $Tr_2$, and a common ground resistor $R_5$ form a matrix circuit.

The collector of the transistor $Tr_1$ is connected to commonly connected emitters of a pair of differential transistors $Tr_3$ and $Tr_4$, and acts as a current source thereof.

Similarly the collector of the transistor $Tr_2$ is connected to commonly connected emitters of a pair of differential transistors $Tr_5$ and $Tr_6$, and acts as a current source thereof.

An in-phase pulse modulation signal is applied to commonly connected bases of the transistors $Tr_3$ and $Tr_6$.

On the other hand, an antiphase pulse modulation signal is applied to commonly connected bases of the transistors $Tr_4$ and $Tr_5$.

The bias currents of the transistors $Tr_3$, $Tr_6$ and $Tr_4$, $Tr_5$ are supplied through resistors $R_4$ and $R_3$ respectively.

The collectors of the transistors $Tr_3$ and $Tr_5$ are commonly connected to a collector resistor $R_8$ and the left signal is generated therefrom.

The collectors of the transistors $Tr_4$ and $Tr_5$ are commonly connected to a collector resistor $R_9$, and the right signal is generated therefrom. Therefore, the multiplication circuit 3 separately multiplies the in-phase and anti-phase pulse modulation signals by the stereo composite signal as illustrated in FIG. 5.

Assuming that the emitter voltage of the transistor $Tr_2$ is $V_E$, then emitter voltage of the transistor $Tr_1$ is expressed as $V_E + C(t)$.

Therefore, the collector currents $I_{C1}(t)$ and $I_{C2}(t)$ of the transistors $Tr_1$ and $Tr_2$ are expressed as follows:

$$I_{C1}(t) = \frac{R_O \cdot V_E + (R_O + R_5) \cdot C(t)}{R_O^2 + 2R_O \cdot R_5} \quad (9)$$

$$I_{C2}(t) = \frac{R_O \cdot V_E - R_5 \cdot C(t)}{R_O^2 + 2R_O \cdot R_5} \quad (10)$$

in which
$R_O = R_6 = R_7$.

Since the pulse modulation signal can be expressed as $\tfrac{1}{2} \pm A \sin \omega_S t$ ($A \leq \tfrac{1}{2}$) in which A is a constant determined by the degree of modulation, and the high frequency components are omitted, the audio components $I_L(t)$ and $I_R(t)$ of the current through the resistors $R_8$ and $R_9$ are expressed as follows:

$$I_L(t) = \frac{1}{R_O^2 + 2R_O \cdot R_5}\left[R_O \cdot V_E + \frac{R_O}{2} \cdot M(t) + \frac{A}{2}(R_O + 2R_5) \cdot S(t)\right] \quad (11)$$

$$I_R(t) = \frac{1}{R_O^2 + 2R_O \cdot R_5}\left[R_O \cdot V_E + \frac{R_O}{2} \cdot M(t) - \frac{A}{2}(R_O + 2R_5) \cdot S(t)\right] \quad (12)$$

If $R_O = 2A.R_5/(1-A)$, then $$I_L(t) = \frac{1-A}{4R_5}[2V_E + M(t) + S(t)] \quad (13)$$

$$I_R(t) = \frac{1-A}{4R_5}[2V_E + M(t) - S(t)] \quad (14)$$

Thus the left and right signals are produced by the multiplier circuit 3.

Figure 6:
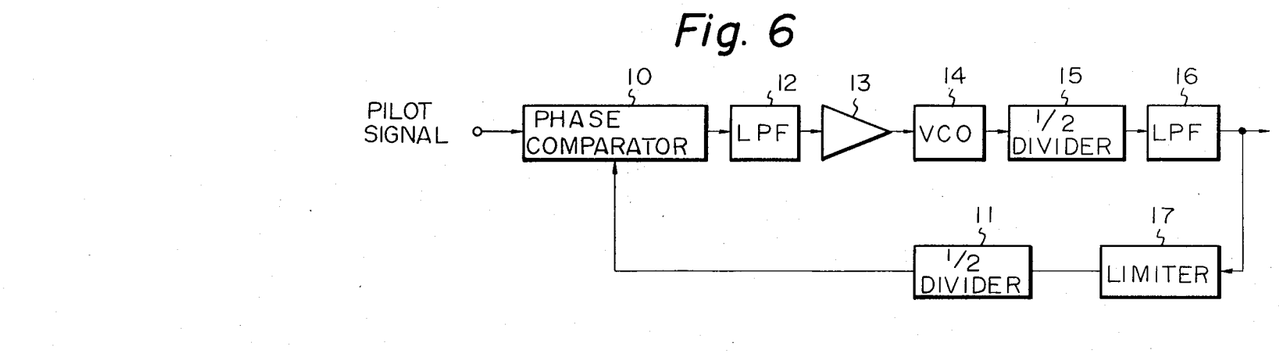
FIG. 6 is a block diagram of an example of the subcarrier signal generator shown in FIG. 3.

Referring to FIG. 6, an example of the sinusoidal subcarrier signal generator 7 will be described.

The circuit comprises a phase comparator 10 which receives the pilot signal from the FM detector and a 19 kHz rectangular-wave signal from a divider 11 to compare the phase of each signal.

The output signal of the phase comparator 10 is applied to a VCO (voltage controlled oscillator) 14 via a low pass filter 12 and a DC amplifier 13.

The output signal of the VCO 14 having the frequency of 76 kHz is divided by the divider 15 to form a square-wave signal of 38 kHz.

A low pass filter 16 is further provided to transform the square-wave output signal of the divider 15 into a sinusoidal signal of 38 kHz.

This sinusoidal signal is applied to a limiter circuit 17 as well as to the pulse modulation circuit to produce a rectanglular-wave signal of 38 kHz.

The rectangular-wave output signal of the limiter circuit is applied to the divider 11 to produce a signal against which the phase of the pilot signal is compared.

Thus a sinusoidal subcarrier signal synchronized with the pilot signal is produced by the circuit 7.

Figure 7:
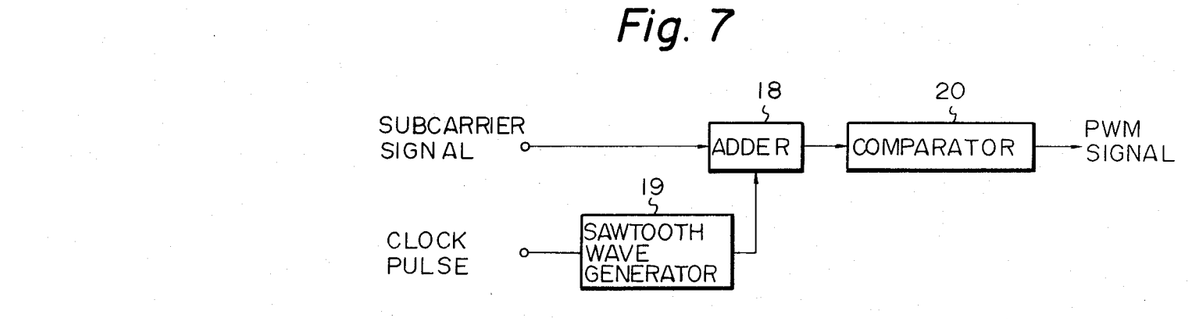
FIG. 7 is a block diagram of an example of the pulse modulation circuit shown in FIG. 3.

Turning to FIG. 7 an example of the pulse modulation circuit will be described.

The circuit shown in FIG. 7 takes the form of a pulse-width modulator circuit and it comprises an adder 18 which receives the sinusoidal subcarrier signal and an output signal of a sawtooth wave generator 19 which receives a clock pulse of a frequency above 500 kHz.

The output signal of the adder 18 is applied to a comparator 20 in which the input signal is compared with a constant reference level such as OV.

The pulse width modulation signal is thus produced by the comparator 20.

Figures 8A, 8B:
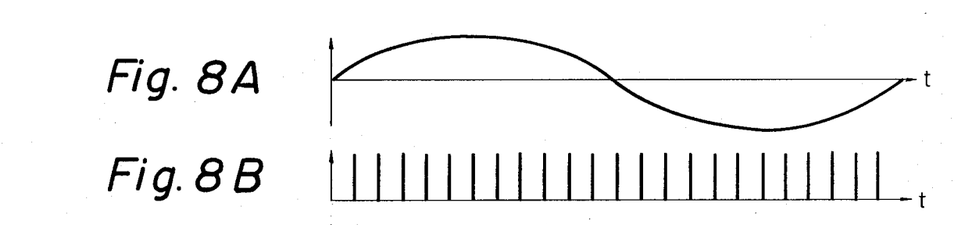
FIGS. 8A through 8E are waveforms showing the operation of the pulse modulation circuit shown in FIG. 7.
Figure 8C:
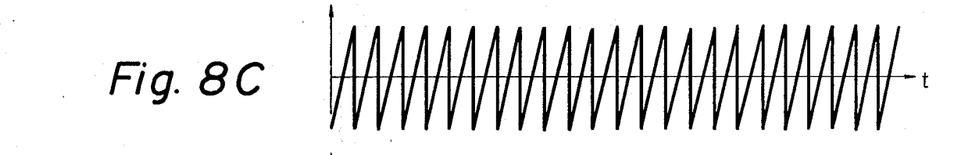
Figures 8D, 8E:
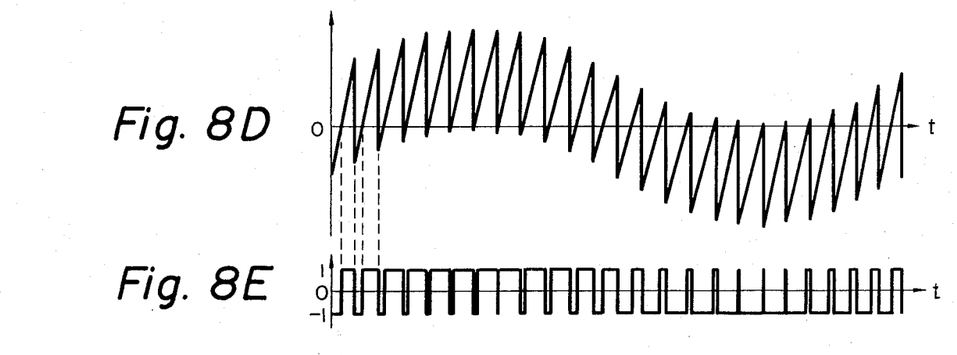

Waveforms at various portions of this pulse width modulation circuit are shown in FIGS. 8A to 8E, in which FIG. 8A shows the sinusoidal subcarrier signal, FIG. 8B shows the high frequency clock pulse signal, FIG. 8C shows the sawtooth signal, FIG. 8D shows the output signal of the adder 18, and FIG. 8E shows the pulse width modulation signal.

As a variation of the above circuit, the pulse width modulation signal can be produced by comparing the sawtooth signal directly with the subcarrier signal.

Figure 9:
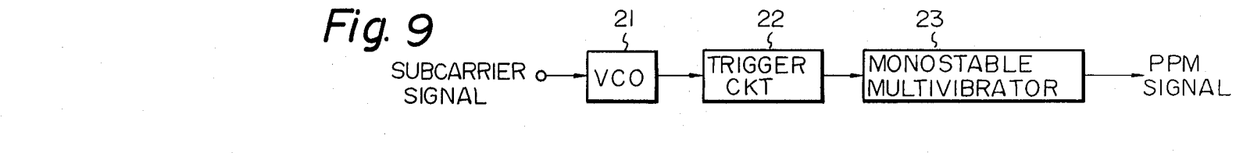
FIG. 9 is a block diagram of another example of pulse modulation circuit shown in FIG. 3.

Turning to FIG. 9 another example of the pulse modulator circuit 8 shown in FIG. 3 will be described.

The circuit shown in FIG. 9 takes the form of a pulse position modulator circuit comprising a voltage controlled oscillator 21 which receives the sinusoidal subcarrier signal and produces an FM signal modulated by the subcarrier signal.

The output FM signal of the voltage controlled oscillator 21 is applied to a trigger circuit 22 which produces a trigger signal for a monostable multivibrator 23.

An output signal of the monostable multivibrator 23 forms the pulse position modulation signal.

Figure 10A:
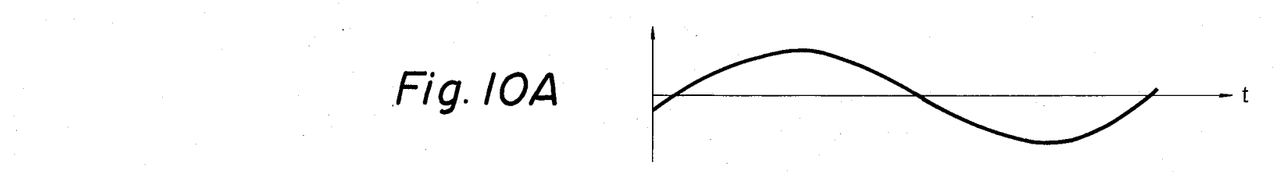
FIGS. 10A through 10D are waveforms showing the operation of the pulse modulation circuit shown in FIG. 9.
Figure 10B:
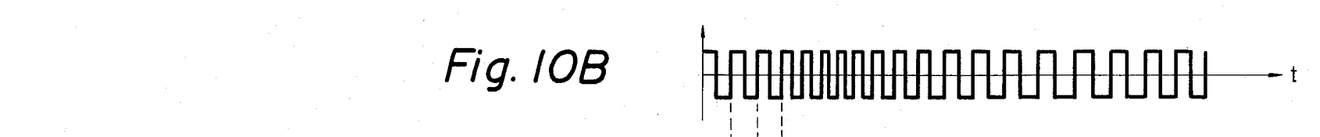
Figure 10C:
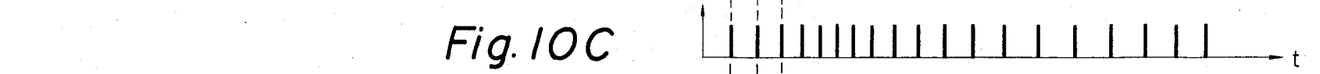
Figure 10D:
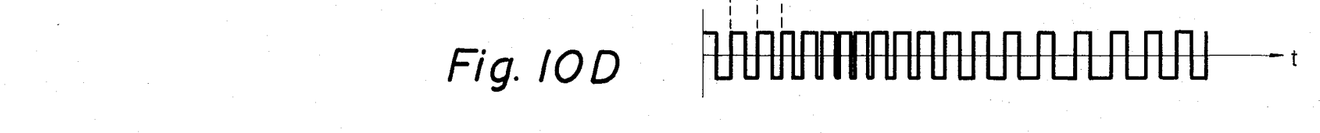

FIGS. 10A through 10D show waveforms at various positions above the described pulse position modulator circuit in which FIG. 10A shows the sinusoidal subcarrier signal, FIG. 10B shows the output signal of the voltage controlled oscillator 21, FIG. 10C shows the trigger pulse signal and FIG. 10D shows the pulse position modulation signal produced by the monostable multivibrator 23.

It will be appreciated from the foregoing, an FM stereo demodulator is provided according to the present invention, and in which separation and distortion characteristics are improved by using a high frequency switching signal and by eliminating the low pass filters.

Above, preferred embodiments of the present invention have been described. It should be understood, however, that the foregoing description has been for illustrative purposes only, and is not intended to limit the scope of the invention. Rather, there are numerous equivalents to the preferred embodiments and such are intended to be covered by the appended claims.

What is claimed is:

1. An FM stereo demodulator connected to an FM detector circuit for reproducing left and right signals from a stereo composite signal demodulated at the FM detector circuit from an FM-IF signal comprising:
   a subcarrier signal generating means responsive to said stereo composite signal for generating a sinusoidal subcarrier signal synchronized with a pilot signal component of said stereo composite signal;
   a pulse generation means responsive to said sinusoidal subcarrier signal, for generating a first pulse modulation signal and a second pulse modulation signal, each having a predetermined pulse repetition frequency higher than the frequency of said sinusoidal subcarrier signal and the edge positions of each pulses thereof varying with said sinusoidal subcarrier signal, said second pulse modulation signal being opposite in phase with respect to said first pulse modulation signal; and
   multiplication means for multiplying said stereo composite signal separately by said first and second pulse modulation signals, thereby reproducing said left and right signals.

2. An FM stereo demodulator as recited in claim 1, wherein said pulse generator comprises a pulse width modulation circuit which generates pulse width modulation signals modulated by said sinusoidal subcarrier signal.

3. An FM stereo demodulator as recited in claim 1, wherein said pulse generator comprises a pulse position modulator circuit which generates pulse position modulation signals modulated by said sinusoidal subcarrier signal.

4. An FM stereo demodulator as recited in claim 2, wherein said pulse width modulator circuit comprises:
   a saw tooth signal generating means for generating a sawtooth signal having said predetermined frequency higher than the frequency of said sinusoidal subcarrier signal;
   an adder for adding said sawtooth signal and said sinusoidal signal; and
   a comparator for comparing an output signal of said adder with a constant level reference signal, thereby producing the pulse width modulation signal.

5. An FM stereo demodulator as recited in claim 3, wherein said pulse position modulation circuit comprises:
   a voltage controlled oscillator having a free-running frequency of said predetermined frequency higher than the frequency of sinusoidal subcarrier signal and the oscillation frequency thereof being varied in accordance with said sinusoidal subcarrier signal;
   a trigger circuit for producing a train of trigger signals in accordance with an oscillation output signal of said voltage controlled oscillator; and
   a monostable multivibrator being triggered by said trigger signals for producing the pulse position modulation signal in accordance with said train of trigger signals.

6. An FM stereo demodulator connected to an FM detector circuit for reproducing left and right signals from a stereo composite signal demodulated at the FM detector circuit from an FM-IF signal, comprising:
   a subcarrier signal generating means responsive to said stereo composite signal from generating a sinusoidal subcarrier signal synchronized with a pilot signal component of said stereo composite signal;
   a pulse signal generating means for generating a first and second pulse width modulation signals, each having a predetermined pulse repetition frequency higher than the frequency of said sinusoidal subcarrier signal and the pulse width of each pulse thereof being modulated in accordance with said sinusoidal subcarrier signal, said second pulse modulation signal being opposite in phase with respect to said first pulse width modulation signal; and
   a multiplication means for multiplying said stereo composite signal separately by said first and second pulse modulation signals, thereby reproducing said left and right signals.

7. An FM stereo demodulator as recited in claim 6, wherein said pulse signal generating means comprises:

a sawtooth signal generator for generating a sawtooth signal having said predetermined frequency higher than the frequency of said sinusoidal subcarrier signal;

an adder for adding said sawtooth signal and said sinusoidal subcarrier signal; and a comparator for comparing an output signal of said adder with a reference signal having a predetermined constant level, thereby producing said pulse width modulation signal.

8. An FM stereo demodulator connected to an FM detector circuit for reproducing left and right signals from a stereo composite signal demodulated at the FM detector circuit from an FM-IF signal, comprising:

a subcarrier signal generating means responsive to said stereo composite signal for generating a sinusoidal subcarrier signal synchronized with a pilot signal component of said stereo composite signal;

a pulse signal generating means responsive to said sinusoidal subcarrier signal, for generating a first and second pulse modulation signals, each having a predetermined pulse repetition frequency higher than the frequency of said sinusoidal subcarrier signal and the pulse position of each pulse thereof being determined in accordance with said sinusoidal subcarrier signal, said second pulse modulation signal being opposite in phase with respect to said first pulse modulation signal; and a multiplication means for multiplying said stereo composite signal separately by said first and second pulse modulation signals, thereby reproducing said left and right signals.

9. An FM stereo demodulator as recited in claim 8, wherein said pulse signal generating means comprises:

a voltage controlled oscillator having a free-running frequency of said predetermined frequency higher than the frequency of said sinusoidal subcarrier signal, and the oscillation frequency thereof being varied in accordance with said sinusoidal subcarrier signal;

a trigger circuit for producing a train of trigger signals in accordance with the oscillation output signal of said voltage controlled oscillator; and a monostable multivibrator being triggered by said trigger signals for producing said pulse modulation signals in accordance with said train of trigger signals.

* * * * *